(12) United States Patent  (10) Patent No.: US 8,492,506 B2
Yoshida et al.  (45) Date of Patent: Jul. 23, 2013

(54) POLYIMIDE RESIN COMPOSITION, POLYIMIDE PRECURSOR RESIN COMPOSITION FOR THE SAME, PRODUCTION METHOD THEREOF, AND POLYIMIDE FILM AND PRODUCTION METHOD THEREOF

(75) Inventors: Takeshi Yoshida, Kyoto (JP); Akira Shigeta, Kyoto (JP); Yoshiaki Echigo, Kyoto (JP)

(73) Assignee: Unitika Ltd., Amagasaki-Shi, Hyogo (JP)

( * ) Notice: Subject to any disclaimer, the term of this patent is extended or adjusted under 35 U.S.C. 154(b) by 152 days.

(21) Appl. No.: 12/310,288

(22) PCT Filed: Aug. 7, 2008

(86) PCT No.: PCT/JP2008/064190
§ 371 (c)(1),
(2), (4) Date: Feb. 19, 2009

(87) PCT Pub. No.: WO2009/022619
PCT Pub. Date: Feb. 19, 2009

(65) Prior Publication Data
US 2010/0273974 A1 Oct. 28, 2010

(30) Foreign Application Priority Data

Aug. 14, 2007 (JP) .................................. 2007-211577
Mar. 4, 2008 (WO) .................. PCT/JP2008/053859

(51) Int. Cl.
C08G 73/10 (2006.01)
C08G 73/00 (2006.01)
C08G 6/00 (2006.01)
B29D 7/00 (2006.01)

(52) U.S. Cl.
USPC ........... 528/322; 528/229; 528/288; 528/310; 264/212

(58) Field of Classification Search
USPC ................... 528/229, 322, 310, 288; 264/212
See application file for complete search history.

(56) References Cited

U.S. PATENT DOCUMENTS 5,288,843 A 2/1994 Tamai et al.
5,438,105 A 8/1995 Nagata

FOREIGN PATENT DOCUMENTS

JP 63-305166 12/1988
JP 02-115265 4/1990
JP 04-011656 1/1992

(Continued)

OTHER PUBLICATIONS

Kishimoto et al; Black pastes—films therefrom; Aug. 2000; Unitika Ltd, JP, Chem Abstract 133: 164959.*

(Continued)

Primary Examiner — Duc Truong

(74) Attorney, Agent, or Firm — Birch, Stewart, Kolasch & Birch, LLP

(57) ABSTRACT

An object of the present invention, which was made to solve the problems above, is to provide a polyimide precursor resin composition superior in transparency allowing reduction of the residual volatile material rate during molding and giving a polyimide resin composition (e.g., polyimide film) superior in mechanical properties and transparency even when a cheaper polyamide-imide is used. The present invention relates to a polyimide precursor resin composition, comprising a polyamide-imide (A) containing a diamine monomer unit represented by the following formula (1) and a polyamic acid (B) containing at least one kind of monomer unit selected tetracarboxylic acid monomer units represented by the following formulae (2p) to (2r), wherein the haze of the film having a thickness of 40 μm obtained by imidation of the polyimide precursor resin composition is 4% or less:

[Formula 1]

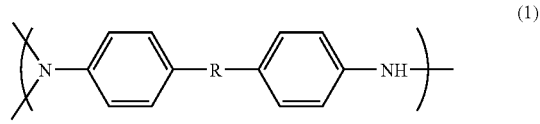

(1)

(wherein, R represents an alkylene group having 1 to 5 carbon atoms);

[Formula 2]

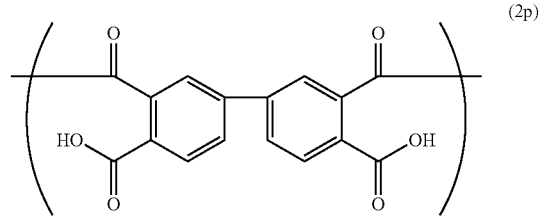

(2p)

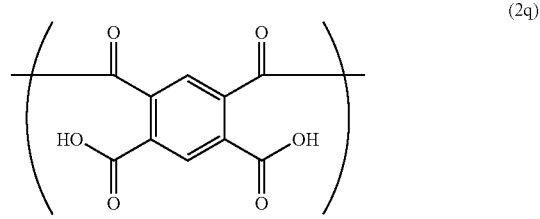

(2q)

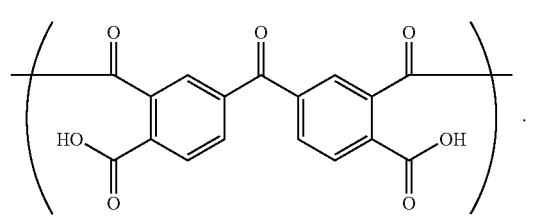

(2r)

23 Claims, No Drawings

FOREIGN PATENT DOCUMENTS

| JP | 04-189827 | 7/1993 |
|----|-----------|--------|
| JP | 06-032901 | 2/1994 |
| JP | 2000-191908 | 7/2000 |
| JP | 2005-325329 | 11/2005 |
| JP | 2008-016266 | 1/2008 |

OTHER PUBLICATIONS

Furukawa et al; Powdered—their manufacture; May 1999; Unitika Ltd, JP, Chem Abstract 131: 5729.*

Seto et al; Polymide—producing the film; Dec. 1997, Unitika Ltd, JP, Chem Abstract 128: 76684.*

English translation of International Preliminary Report on Patentability (Form PCT/IB/338 and 373) and Written Opinion of the International Searching Authority(Form PCT/ISA/237) Issued in PCT/JP2008/064190.

* cited by examiner

POLYIMIDE RESIN COMPOSITION, POLYIMIDE PRECURSOR RESIN COMPOSITION FOR THE SAME, PRODUCTION METHOD THEREOF, AND POLYIMIDE FILM AND PRODUCTION METHOD THEREOF

RELATED APPLICATIONS

The present application is a 35 U.S.C. §371 national stage filing of International Patent Application No. PCT/JP2008/064190, filed Aug. 7, 2008, to which priority is claimed under 35 U.S.C. §120 and through which priority is claimed under 35 U.S.C. §119 to Japanese Priority Patent Application No. 2007-211577, filed Aug. 14, 2007.

TECHNICAL FIELD

The present invention relates to a polyimide resin composition, a polyimide precursor resin composition for the same, a production method of those compositions, and a polyimide film and a production method thereof.

BACKGROUND ART

Polyimide resins are superior in heat resistance, mechanical properties and electrical characteristics and thus, have been used widely as electric and electronic parts and aerospace materials. Because of their superior chemical resistance, polyimide resins are less soluble in solvent and thus, polyamic acids, precursors of polyimides, have been widely used. For preparation of final products such as film, a solution of polyamic acid should be applied and then imidated, for example, by heat or chemistry treatment. However, the polyamic acid is accompanied with solvent vaporization and dehydration during imidation, i.e., during film formation, leaving shrinkage stress in the resulting film and possibly causing problems of deformation and warp of the film.

Proposed as the means to solve the problems is a method of blending a polyamic acid with a polyamide-imide (see Patent Documents 1 and 2). For example in the case of Patent Document 1, the polyamide-imide should be blocked at the terminal and the insulation film obtained from a mixture of polyamide-imide and polyamic acid had a sea-island structure, showing that the components therein were not compatible with each other. Disadvantageously for that reason, the final product from such a mixture was less transparent. Alternatively in the case of Patent Document 2, the polyamide-imide and the polyamic acid were compatible with each other and gave a transparent film, but the method had a problem that the raw material naphthalene diisocyanate, which gives the component structure essential for the polyamide-imide, is expensive and highly toxic, and thus the product is restricted in its flexibility of use.

Patent Document 1: Japanese Patent application Laid-Open No. 2008-016266
Patent Document 2: Japanese Patent application Laid-Open No. 2005-325329

DISCLOSURE OF INVENTION

Technical Problems to be Solved

An object of the present invention, which was made to solve the problems above, is to provide a polyimide precursor resin composition superior in transparency allowing reduction of the residual volatile material rate during molding and giving a polyimide resin composition (e.g., polyimide film) superior in mechanical properties and transparency even when a cheaper polyamide-imide is used, and a production method thereof.

Another object of the present invention is to provide cost-effectively a polyimide resin composition (e.g., polyimide film) resistant to deformation and warping and superior in mechanical properties and transparency.

Means to Solve the Problems

After intensive studies to solve the problems above, the inventors of the present invention have found that a polyimide precursor resin composition containing a specific polyamide-imide (PAI) and a specific polyamic acid achieves the object, and made the present invention.

The present invention has the following aspects <1> to <23>:

<1> A polyimide precursor resin composition, comprising a polyamide-imide (A) containing a diamine monomer unit represented by the following formula (1) and a polyamic acid (B) containing at least one kind of monomer unit selected from the group consisting of tetracarboxylic acid monomer units represented by the following formulae (2p) to (2r), wherein the haze of the film having a thickness of 40 μm obtained by imidation of the polyimide precursor resin composition is 4% or less:

[Formula 1]

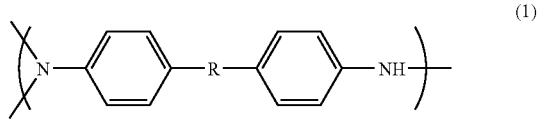

(wherein, R represents an alkylene group having 1 to 5 carbon atoms);

[Formula 2]

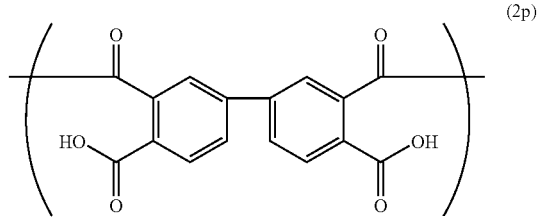

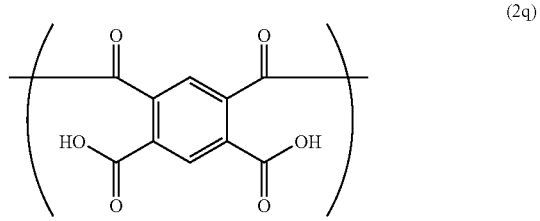

-continued

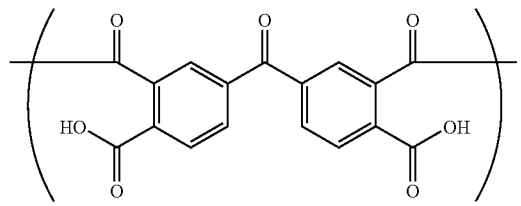

(2r)

<2> The polyimide precursor resin composition according to <1>, wherein the polyamic acid (B) contains a diamine monomer unit represented by the following formula (3):

[Formula 3]

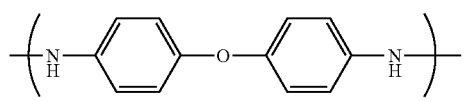

(3)

<3> The polyimide precursor resin composition according to <1>, wherein the content ratio (A/B) of the polyamide-imide (A) to the polyamic acid (B), is 1/99 to 99/1 by mass.

<4> The polyimide precursor resin composition according to <1>, being obtained by reacting a diamine component with a tetracarboxylic acid component in the presence of the polyamide-imide (A).

<5> A method of producing the polyimide precursor resin composition of <1>, comprising producing a polyamic acid (B) by reacting a diamine component with a tetracarboxilic acid component in the presence of a polyamide-imide (A).

<6> A method of producing the polyimide precursor resin composition of <1>, comprising:
producing a polyamic acid (B) by reacting a diamine component with a tetracarboxylic acid component in the presence of the polyamide-imide (A) and;
mixing the resulting product with one or more polyamide-imides (A) and/or one or more separately prepared polyamic acids (B).

<7> The polyimide precursor resin composition according to <1>, wherein the polyamic acid (B) is a polyamic acid (b1) containing one kind of monomer unit selected from the group consisting of tetracarboxylic acid monomer units represented by formulae (2p) to (2r) alone as the tetracarboxylic acid monomer unit, and
a polyamic acid (c1) containing a tetracarboxylic acid monomer unit other than the tetracarboxylic acid monomer unit of the polyamic acid (b1) is further contained.

<8> The polyimide precursor resin composition according to <7>, wherein the polyamic acid (B) is a polyamic acid (b1) containing the tetracarboxylic acid monomer unit represented by formula (2p) alone as the tetracarboxylic acid monomer unit and the polyamic acid (c1) contains the tetracarboxylic acid monomer unit represented by formula (2q).

<9> The polyimide precursor resin composition according to <7>, wherein the polyamic acid (B) is a polyamic acid (b1) containing the tetracarboxylic acid monomer unit represented by formula (2q) alone as the tetracarboxylic acid monomer unit, and the polyamic acid (c1) contains the tetracarboxylic acid monomer unit represented by formula (2p).

<10> The polyimide precursor resin composition according to <7>, wherein the polyamic acid (c1) contains the diamine monomer unit represented by formula (3).

<11> The polyimide precursor resin composition according to <7>, being obtained by producing a polyamic acid (B) in reaction of a diamine component with a tetracarboxylic acid component in the presence of the polyamide-imide (A) and mixing the resulting product with the polyamic acid (c1).

<12> A method of producing the polyimide precursor resin composition of <7>, comprising:
producing a polyamic acid (B) by reacting a diamine component with a tetracarboxylic acid component in the presence of a polyamide-imide (A) and;
mixing the resulting product with a polyamic acid (c1).

<13> The polyimide precursor resin composition according to <1>, wherein the polyamic acid (B) is a polyamic acid (b2) containing the diamine monomer unit represented by formula (3) only as the diamine monomer unit, and a polyamic acid (c2) containing a diamine monomer unit other than the diamine monomer unit represented by formula (3) is further contained.

<14> The polyimide precursor resin composition according to <13>, wherein the polyamic acid (c2) contains a diamine monomer unit represented by the following formula (5):

[Formula 4]

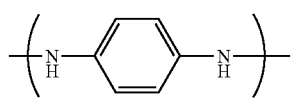

(5)

<15> The polyimide precursor resin composition according to <13>, wherein the polyamic acid (c2) contains the tetracarboxylic acid monomer unit represented by formula (2p).

<16> The polyimide precursor resin composition according to <13>, being obtained by producing a polyamic acid (B) in reaction of a diamine component with a tetracarboxylic acid component in the presence of the polyamide-imide (A) and mixing the resulting product with the polyamic acid (c2).

<17> A method of producing the polyimide precursor resin composition of <13>, comprising;
producing a polyamic acid (B) by reacting a diamine component with a tetracarboxylic acid component in the presence of a polyamide-imide (A) and;
mixing the resulting product with a polyamic acid (c2).

<18> The polyimide precursor resin composition according to <1>, <7>, or <13>, containing a solvent. <19> The polyimide precursor resin composition according to <18>, wherein the solvent is N-methyl-2-pyrrolidone, N,N-dimethylacetamide, or the mixture thereof.

<20> The polyimide precursor resin composition according to <18>, wherein a solid matter concentration thereof is 5 to 50 mass %.

<21> A polyimide resin composition, produced by imidation of the polyimide precursor resin composition according to <1>, <7> or <13>.

<22> A method of producing a polyimide resin composition, comprising imidating the polyimide precursor resin composition according to <1>, <7> or <13>.

<23> A polyimide film, comprising the polyimide resin composition according to <21>.

<24> A method of producing a polyimide film, comprising casting, drying and imidating the polyimide precursor resin composition according to <18>.

Advantageous Effect of the Invention

According to the polyimide precursor resin composition of the present invention is used, it is possible to reduce the residual volatile material rate during drying of the polyimide precursor solution and thus, prevent deformation and warping during imidation, even when a cheaper polyamide-imide is used. In addition, a polyimide resin composition superior in mechanical properties and appearance etc. can be obtained. In particular, because the polyamide-imide and the polyamic acid therein are superior in compatibility, the polyimide precursor resin composition according to the present invention is superior also in transparency. Therefore, the film obtained by imidation of the polyimide precursor resin composition according to the present invention has a haze effectively reduced. Such a material is useful in the fields of electric and electronic parts and aerospace materials.

The polyimide precursor resin composition according to the present invention is produced easily by the method of producing the polyimide precursor resin composition according to the present invention. It is also possible to obtain a transparent polyimide precursor resin composition in which both of the polyamide-imide and the polyamic acid are sufficiently dissolved in each other.

In the present specification, the polyimide precursor means a compound having a so-called polyamic acid structure that gives polyimide by ring closure caused by heating or chemical action.

As will be described in detail, the polyimide precursor resin composition contains a specific polyamide-imide and a specific polyamic acid. Particularly among the polyimide precursor resin compositions, the one containing a solvent additionally will be called a polyimide precursor solution.

The polyimide resin composition means a product obtained by imidation of such a polyimide precursor resin composition.

BEST MODE FOR CARRYING OUT THE INVENTION (Polyimide Precursor Resin Composition)

The polyimide precursor resin composition according to the present invention is a resin composition for production of a polyimide resin composition, in particular a resin composition containing a specific polyamide-imide (A) and a specific polyamic acid (B).

The polyamide-imide (A) contained in the polyimide precursor resin composition according to the present invention contains diamine monomer units and polycarboxylic acid monomer units, wherein the diamine monomer units include at least a diamine monomer unit represented by formula (1) (hereinafter, referred to as DA monomer unit (1)):

[Formula 5]

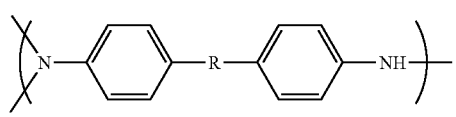

In formula (1), R represents an alkylene group having 1 to 5 carbon atoms, preferably 1 to 3, and examples thereof include methylene group, dimethylene group, trimethylene group, tetramethylene group, pentamethylene group and the like. R is more preferably a methylene group.

The content ratio of the DA monomer unit (1) in polyamide-imide (A) is preferably 60 mol % or more, particulaly 60 to 100 mol %, more preferably 80 to 100 mol %, and most preferably 100 mol %, with respect to the total diamine monomer units in polyamide-imide (A). An excessively low content of the DA monomer unit (1) may lead to lack of compatibility between the polyamide-imide (A) and the polyamic acid (B), clouding of the polyimide precursor solution and deterioration in mechanical properties of the polyimide resin composition obtained.

The content ratio of the diamine monomer units in the polyamide-imide (A) can be calculated from the component rate of the diamine components used as raw materials. It is because the diamine components react in proportion to the component ratio, forming a polyamide-imide stoichiometrically.

The method of introducing the DA monomer units (1) into the polyamide-imide (A) is not particularly limited, and, for example, a method of using diisocyanate components or/and diamine components containing the DA monomer unit (1) as raw materials.

Typical examples of the diisocyanate components containing the DA monomer unit (1) include 4,4'-diphenylmethane diisocyanate (MDI), 4,4'-diphenylethane diisocyanate, 4,4'-diphenylpropane diisocyanate, 4,4'-diphenylbutane diisocyanate, 4,4'-diphenylpentane diisocyanate and the like.

Typical examples of the diamine components containing the DA monomer unit (1) include 4,4'-diphenylmethanediamine, 4,4'-diphenylethanediamine, 4,4'-diphenylpropanediamine, 4,4'-diphenylbutanediamine, 4,4'-diphenylpentanediamine and the like.

The polyamide-imide may have diamine monomer units other than the DA monomer unit (1).

Examples of the raw materials providing the other diamine monomer units include diisocyanate components and diamine components shown below:

Typical examples of the diisocyanate components include aliphatic diisocyanates such as ethylene diisocyanate, 1,2-propylene diisocyanate and hexamethylene diisocyanate; alicyclic diisocyanates such as 1,4-cyclohexane diisocyanate and 1,3-cyclohexane diisocyanate; and aromatic diisocyanates such as m-phenylene diisocyanate, p-phenylene diisocyanate and 4,4'-diphenylether diisocyanate.

Typical examples of the diamine components include aliphatic diamines such as ethylenediamine, propylenediamine and hexamethylenediamine; alicyclic diamines such as 1,4-cyclohexanediamine and 1,3-cyclohexanediamine; aromatic diamines such as m-phenylenediamine, p-phenylenediamine, and 4,4'-diaminodiphenylether; and the like.

The polycarboxylic acid monomer unit contained in the polyamide-imide (A) is normally tricarboxylic acid monomer unit, and trimellitic anhydride is used favorably as the acid component (raw material) for the tricarboxylic acid monomer unit. The tricarboxylic acid monomer unit is derived from a tricarboxylic acid monoanhydride. The acid components used in preparation of the polyamide-imide (A) according to the present invention may have part of the polycarboxylic acid monomer components replaced with a tetracarboxylic acid such as pyromellitic acid, biphenyltetracarboxylic acid, biphenylsulfonetetracarboxylic acid, benzophenonetetracarboxylic acid, biphenylethertetracarboxylic acid, ethylene glycol anhydrobistrimellitate, or propylene glycol anhydrobistrimellitate or the anhydride thereof in an amount in the range that does not impair the advantageous effect of the present invention. The content ratio of the tricarboxylic acid monomer unit in the polyamide-imide (A) is preferably 80 mol % or more, more preferably 80 to 100 mol %, still more preferably 90 to 100 mol %, and most preferably 100 mol % with respect to the total polycarboxylic acid monomer units in the polyamide-imide (A). The content ratio of the tricarboxylic acid monomer unit can also be calculated from the component ratio of the polycarboxylic acid components used as raw materials.

The polyamide-imide (A) can be prepared in reaction of diisocyanates or diamines with acid components such as trimellitic anhydride in solvent. The solvent for use then is for example a polar solvent such as N-methyl-2-pyrrolidone (NMP), N,N'-dimethylacetamide, N,N'-dimethylformamide, or γ-butyrolactone.

The other production conditions are not particularly limited, and it may be prepared by a common method, but, for example, the reaction temperature for the reaction of diisocyanate/diamine components with acid components is selected properly in the range between room temperature to 200° C. The structure of the polyamide-imide obtained can be analyzed for example by $^1$H-NMR.

The number-average molecular weight of the polyamide-imide (A) is not particularly limited, insofar as the object of the present invention is achieved, but preferably 1,000 to 100,000, particularly 6,000 to 30,000. The viscosity, as determined by using NMP as a solvent at a solute concentration of 15 mass %, is preferably 0.5 to 50 Pa·s/30° C., in particular 1 to 30 Pa·s/30° C.

In the present specification, the number-average molecular weight is a value determined by using HP1100 (manufactured by Hewlett Packard) and the viscosity, a value determined by using DVL-B2 (manufactured by Tokimec).

A commercially available product may be used as the polyamide-imide (A). Examples of the commercially available polyamide-imide include VYLOMAX® HR11NN, HR14ET, HR15ET and HR16NN manufactured by Toyobo Co., Ltd, HPC-5000, HPC-7200, HPC-9000, and HPC-9200 manufactured by Hitachi Chemical Company, Ltd, and the like. These commercially available polyamide-imides are normally provided as solutions, as dissolved in an organic solvent such as NMP.

The polyamide-imide (A) for use may be a so-called blocking agent-free polymer wherein no functional group on the terminals of the molecule is blocked with a blocking agent. Use of such a blocking agent-free polyamide-imide (A) can make the polyamide-imide and the polyamic acid sufficiently compatible with each other, without causing problems such as increase in viscosity.

The polyamic acid (B) contained in the polyimide precursor resin composition according to the present invention contains tetracarboxylic acid monomer units and diamine monomer units, and the tetracarboxylic acid monomer units include at least one kind of monomer unit selected from the group consisting of the tetracarboxylic acid monomer units represented by formulae (2p) to (2r) (hereinafter, these monomer units are referred to collectively as TC monomer unit (2)). It is difficult without presence of the TC monomer unit (2) to make the polyamide-imide (A) and the polyamic acid (B) in the polyimide precursor solution compatible with each other, resulting in deterioration in mechanical properties of the polyimide resin composition obtained. The tetracarboxylic acid monomer unit is a unit derived from a tetracarboxylic dianhydride.

[Formula 6]

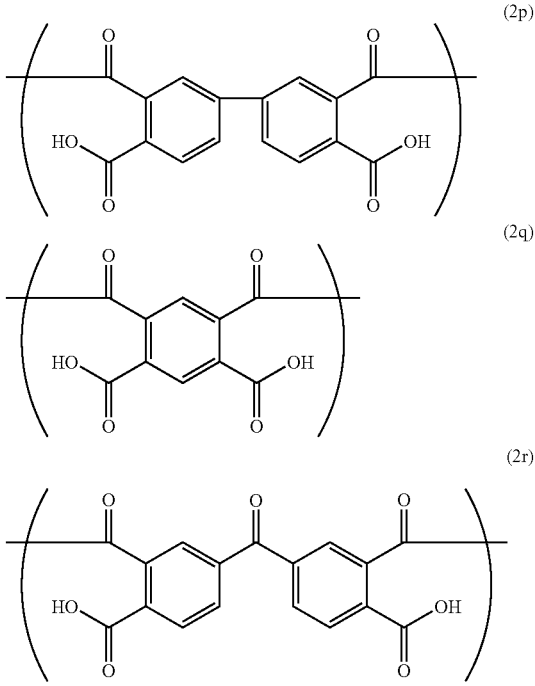

The content ratio of the TC monomer units (2) in the polyamic acid (B) is preferably 30 mol % or more, particularly 35 to 100 mol % and more preferably 100 mol %, with respect to the total tetracarboxylic acid monomers in the polyamic acid (B). From the points of compatibility with the polyamide-imide (A) and easiness in production of the polyimide precursor resin composition, the polyamic acid (B) preferably contains only one kind of monomer unit selected from the group consisting of the tetracarboxylic acid monomer units represented by formulae (2p) to (2r) as the tetracarboxylic acid monomer unit.

The content ratio of the tetracarboxylic acid monomer units in the polyamic acid can be calculated from the component ratio of the tetracarboxylic acid components used as raw materials. It is because the tetracarboxylic acid components react in proportion to the component ratio, giving a polyamic acid stoichiometrically.

The TC monomer units (2) in the polyamic acid (B) can be introduced by using acid components such as 3,3',4,4'-biphenyltetracarboxylic dianhydride (BPDA), pyromellitic dianhydride (PMDA), and 3,3',4,4'-benzophenonetetracarboxylic dianhydride (BTDA) as raw materials. The BPDA-derived tetracarboxylic acid monomer unit corresponds to the tetracarboxylic acid monomer unit represented by formula (2p) (hereinafter, TC monomer unit (2p)). The PMDA-derived tetracarboxylic acid monomer unit corresponds to the tetracarboxylic acid monomer unit represented by formula (2q) (hereinafter, referred to TC monomer unit (2q)). The BTDA-derived tetracarboxylic acid monomer unit corresponds to the tetracarboxylic acid monomer unit represented by formula (2r) (hereinafter, referred to as TC monomer unit (2r)).

The polyamic acid (B) may contain tetracarboxylic acid monomer units other than the TC monomer unit (2).

The acid component (raw material) providing the other tetracarboxylic acid monomer unit is not particularly limited, insofar as it is a tetracarboxylic acid in the form of dianhydride, and examples thereof include aromatic tetracarboxylic acid components.

The aromatic tetracarboxylic acid component is a tetracarboxylic dianhydride containing an aromatic ring, and typical examples thereof include 2,3,3',4'-biphenyltetracarboxylic dianhydride, 2,2',3,3'-biphenyltetracarboxylic dianhydride, 2,2',6,6'-biphenyltetracarboxylic dianhydride, 2,3,6,7-naphthalenetetracarboxylic dianhydride, 1,2,5,6-naphthalenetetracarboxylic dianhydride, 2,2-bis(3,4-dicarboxyphenyl)propane dianhydride, bis(3,4-dicarboxyphenyl)sulfone dianhydride, bis(3,4-dicarboxyphenyl)ether dianhydride, 3,4,9,10-perylenetetracarboxylic dianhydride, naphthalene-1,2,4,5-tetracarboxylic dianhydride, naphthalene-1,4,5,8-tetracarboxylic dianhydride, benzene-1,2,3,4-tetracarboxylic dianhydride and the like, and these compounds may be used alone or as a mixture of two or more thereof.

If the polyamic acid (B) contains the other tetracarboxylic acid monomer units, the content ratio of the monomer units is preferably 40 mol % or less, in particular 20 mol % or less, with respect to the total tetracarboxylic acid monomers in the polyamic acid (B).

The diamine monomer unit contained in the polyamic acid (B) is not particularly limited, and is preferably, for example, an aromatic diamine monomer unit.

The aromatic diamine component providing the aromatic diamine monomer unit is a diamine compound containing an aromatic ring, and examples thereof include meta-phenylenediamine (MPD), para-phenylenediamine (PPD), 4,4'-diaminodiphenylpropane, 4,4'-diaminodiphenylmethane, 3,3'-diaminodiphenylmethane, 4,4'-diaminodiphenylsulfide, 4,4'-diaminodiphenylsulfone, 3,3'-diaminodiphenylsulfone, 3,4'-diaminodiphenylsulfone, 4,4'-diaminodiphenylether (4,4'-ODA), 3,4'-diaminodiphenylether (3,4'-ODA), 4,4'-diaminobenzophenone, 3,3'-diaminobenzophenone, 1,4-bis(4-aminophenoxy)benzene (TPE-Q), 1,3-bis(4-aminophenoxy)benzene (TPE-R), the derivative thereof, and the like, and these compounds may be used alone or as a mixture. In particular from the point of compatibility with the polyamide-imide (A), preferably at least 4,4'-ODA is used, and more preferably 4,4'-ODA is used alone. Use of a mixture of PPD and 4,4'-ODA as the diamine components is preferable, for improvement in mechanical properties and reduction of production cost. The 4,4'-ODA-derived diamine monomer unit corresponds to the diamine monomer unit represented by formula (3) (hereinafter, referred to as DA monomer unit (3)). The PPD-derived diamine monomer unit corresponds to the diamine monomer unit represented by formula (5) (hereinafter, referred to as DA monomer unit (5)).

[Formula 7]

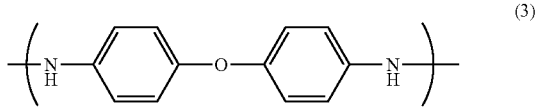

(3)

[Formula 8]

(5)

If the polyamic acid (B) contains the DA monomer unit (3) (4,4'-ODA monomer unit), the content ratio of the monomer unit is preferably 30 mol % or more, particularly 35 to 100 mol % and most preferably 100 mol % with respect to the total diamine monomer units in the polyamic acid (B). If the polyamic acid (B) contains the DA monomer unit (5) (PPD monomer unit) additionally, the content ratio of the monomer unit is preferably 80 mol % or less, in particular 50 to 70 mol % with respect to the total diamine monomer units in the polyamic acid (B).

The content ratio of the diamine monomer units in the polyamic acid can be calculated from the component ratio of the diamine components used as raw materials. It is because the diamine components react in proportion to the component ratio, giving a polyamic acid stoichiometrically.

The content ratio of the polyamic acid (B) to the polyamide-imide (A), (A/B), is normally 1/99 to 99/1, preferably 10/90 to 90/10, more preferably 30/70 to 80/20 by mass. An excessively small polyamide-imide (A) content ratio leads to increase in the rate of residual volatile materials, consequently giving a product having residual shrinkage stress and thus causing the problems of deformation and warp. On the contrary, an excessively high content ratio prohibits production of polyimide resin compositions (in particular, film) sufficiently favorable in mechanical properties.

The content ratio of the polyamide-imide (A) to the polyamic acid (B) used is a value calculated from the ratio of the total amounts of respective monomer components used as raw materials.

The polyamic acid (B) can be prepared by polyaddition of predetermined acid components and predetermined diamine components. It can be prepared in the production process for the polyimide precursor resin composition, as will be described below in detail.

In the polyimide precursor resin composition according to the present invention, part of the terminal groups of the polyamide-imide (A) may be bound to part of the terminal groups of the polyamic acid (B) in reaction.

For example, if the terminal group of the polyamide-imide (A) is a carboxyl group and the terminal group of the polyamic acid is an amino group, these terminal groups can form an amide bond.

Alternatively, for example if the terminal group of the polyamide-imide (A) is an amino group and the terminal group of the polyamic acid is a carboxyl group, these terminal groups can form an amide bond.

Yet alternatively, for example if the terminal group of the polyamide-imide (A) is an isocyanate group and the terminal group of the polyamic acid is an amino group, these terminal groups can form a urea bond.

Yet alternatively, for example if the terminal group of the polyamide-imide (A) is an isocyanate group and the terminal group of the polyamic acid is a carboxyl group, these terminal groups can form an amide bond.

The polyimide precursor resin composition according to the present invention may contain a polyamic acid (C) different at least in composition from the polyamic acid (B). It is possible by controlling the composition of the polyamic acid (B) and the polyamic acid (C), to improve various properties of the polyimide precursor resin composition or the polyimide resin composition. In particular, it is possible to strengthen the mechanical property-improving effect and the production cost-reducing effect further, when two or more tetracarboxylic acid components are used in combination as the polyamic acid monomer (I) or when two or more diamine components are used (II).

In the case of (I), for example, the polyamic acid (b1) shown below is used as the polyamic acid (B) and the polyamic acid (c1) shown below as the polyamic acid (C). In this way, it is possible to improve the mechanical properties further.

Among the polyamic acids (B) above, the polyamic acid (b1) preferably contains one kind of monomer unit selected from the group consisting of the TC monomer units (2p) to (2r) described above alone as the tetracarboxylic acid monomer unit.

The diamine monomer unit contained in the polyamic acid (b1) is not particularly limited, and is, for example, an aromatic diamine monomer unit similar to that described for the polyamic acid (B). The polyamic acid (b1) favorable for reduction of the content of residual volatile materials and improvement in compatibility, contains monomer units derived from one or more aromatic diamine components selected from the group consisting of MPD, PPD, 3,4'-ODA, 4,4'-ODA, TPE-Q, and TPE-R, more preferably at least the DA monomer unit (3) (4,4'-ODA monomer unit), and most preferably the DA monomer unit (3) only as the diamine monomer unit.

The content ratio of the DA monomer unit (3) in the polyamic acid (b1) is preferably 50 mol % or more, particularly 70 to 100 mol % or more, and more preferably 100 mol %, with respect to the total diamine monomer units in the polyamic acid (b1).

The polyamic acid (c1) contains tetracarboxylic acid monomer units and diamine monomer units, and the tetracarboxylic acid monomer units include tetracarboxylic acid monomer units other than tetracarboxylic acid monomer units for the polyamic acid (b1).

Examples of the tetracarboxylic acid monomer units contained in the polyamic acid (c1) include monomer units derived from one or more aromatic tetracarboxylic acid components selected from aromatic tetracarboxylic acid components other than the tetracarboxylic acid monomer for the polyamic acid (b1), among the tetracarboxylic acid components for polyamic acid (B) described above. Combination of the tetracarboxylic acid monomer unit contained in the polyamic acid (b1) and the tetracarboxylic acid monomer unit contained in the polyamic acid (c1) can reduce residual volatile materials and the production cost.

Typical examples of the favorable combination of the tetracarboxylic acid monomer unit contained in the polyamic acid (b1) and the tetracarboxylic acid monomer unit contained in the polyamic acid (c1) include the followings: The combination will be shown below in the order of the tetracarboxylic acid monomer unit contained in the polyamic acid (b1) and the tetracarboxylic acid monomer unit contained in the polyamic acid (c1).

Combination 1; TC monomer unit (2p)-TC monomer unit (2q);
Combination 2; TC monomer unit (2p)-TC monomer unit (2r);
Combination 3; TC monomer unit (2q)-TC monomer unit (2p);
Combination 4; TC monomer unit (2q)-TC monomer unit (2r);
Combination 5; TC monomer unit (2r)-TC monomer unit (2p); and
Combination 6; TC monomer unit (2r)-TC monomer unit (2q).

More favorable combinations are combinations 1 and 3 above.

In the combinations above, the content ratio of the predetermined tetracarboxylic acid monomer units contained in the polyamic acid (c1) is preferably 50 mol % or more, particularly 70 to 100 mol % or more and more preferably 100 mol %, with respect to the total tetracarboxylic acid monomer units in the polyamic acid (c1). Thus, more favorable polyamic acid (c1) contains a predetermined tetracarboxylic acid monomer unit alone as the tetracarboxylic acid monomer unit.

The diamine monomer unit contained in the polyamic acid (c1) is not particularly limited, and examples thereof include aromatic diamine monomer units similar to those described for the polyamic acid (B). The polyamic acid (c1) favorable for reduction of residual volatile materials and improvement in compatibility contains monomer units derived from one or more aromatic diamine components selected from the group consisting of MPD, PPD, 3,4'-ODA, 4,4'-ODA, TPE-Q and TPE-R, more preferably at least the DA monomer unit (3) (4,4'-ODA monomer unit), and most preferably the DA monomer unit (3) only as the diamine monomer unit.

The content ratio of DA monomer unit (3) in the polyamic acid (c1) is preferably 50 mol % or more, particulaly 70 to 100 mol % or more and more preferably 100 mol % with respect to the total diamine monomer units in the polyamic acid (c1).

In the case of (II), for example, the polyamic acid (b2) shown below is used as the polyamic acid (B) and the polyamic acid (c2) shown below is used as the polyamic acid (C). In this way, it is possible to improve mechanical properties further.

Among the polyamic acids (B) above, the polyamic acid (b2) contains a DA monomer unit (3) (4,4'-ODA monomer unit) alone as the diamine monomer unit. Thus, the polyamic acid (b2) contains at least one kind of monomer unit selected from the group consisting of the TC monomer units (2p) to (2r) described above (TC monomer unit (2)) as the tetracarboxylic acid monomer unit and a DA monomer unit (3) alone as the diamine monomer unit. The polyamic acid (b2) favorable for improvement in compatibility and mechanical properties is that containing one kind of monomer unit selected from the group consisting of the TC monomer units (2p) to (2r) described above alone as the tetracarboxylic acid monomer unit.

Examples of tetracarboxylic acid monomer units that may be contained in the polyamic acid (b2) include monomer units derived from one or more aromatic tetracarboxylic acid components selected from the aromatic tetracarboxylic acid components for the polyamic acid (B) described above.

The content ratio of the TC monomer unit (2) in the polyamic acid (b2) is preferably 50 mol % or more, particularly 70 to 100 mol % or more and more preferably 100 mol % with respect to the total tetracarboxylic acid monomer units in the polyamic acid (b2).

The polyamic acid (c2) contains tetracarboxylic acid monomer units and diamine monomer units and the diamine monomer units include diamine monomer units other than the DA monomer unit (3) (4,4'-ODA monomer unit).

Examples of the diamine monomer units that may be contained in the polyamic acid (c2) include monomer units derived from one or more aromatic diamine components selected from the aromatic diamine component excluding 4,4'-ODA in the diamine components for the polyamic acid (B) described above. Preferably, monomer units derived from one or more aromatic diamine components selected from MPD, PPD, 3,4'-ODA, 4,4'-ODA, TPE-Q, and TPE-R are contained.

The polyamic acid (c2) favorable for improvement in mechanical properties and reduction of production cost contains the DA monomer unit (5) (PPD monomer unit), more preferably the DA monomer unit (5) alone as the diamine monomer unit.

The content ratio of the DA monomer unit (5) in the polyamic acid (c2) is preferably 50 mol % or more, particularly 70 to 100 mol % or more and more preferably 100 mol %, with respect to the total diamine monomer units in the polyamic acid (c2).

The tetracarboxylic acid monomer unit contained in the polyamic acid (c2) is not particularly limited, and examples thereof include aromatic tetracarboxylic acid monomer units similar to those described for the polyamic acid (B). The polyamic acid (c2) favorable from the viewpoint of compatibility contains, as the tetracarboxylic acid monomer unit, monomer units derived from one or more aromatic tetracarboxylic acid components selected from the group consisting of PMDA, BPDA, 2,3,3',4'-biphenyltetracarboxylic dianhydride, 2,2',3,3'-biphenyltetracarboxylic dianhydride, 2,2',6,6'-biphenyltetracarboxylic dianhydride and BTDA. A more favorable polyamic acid (c2) contains at least one monomer unit selected from the group consisting of the TC monomer units (2p) to (2r) described above (TC monomer unit (2)), most preferably one kind of monomer unit selected from the group consisting of the TC monomer units (2p) to (2r) described above alone as the tetracarboxylic acid monomer unit.

The content ratio of the TC monomer unit (2) in the polyamic acid (c2) is preferably 50 mol % or more, particularly 70 to 100 mol % or more and more preferably 100 mol % with respect to the total tetracarboxylic acid monomer units in the polyamic acid (c2).

In the present specification, the polyamic acid (B) is meant to include the polyamic acids (b1) and (b2).

The polyamic acid (C) is meant to include the polyamic acids (c1) and (c2).

The polyamic acid (C) can be produced in reaction of the diamine components with the tetracarboxylic acid components in solvent. The solvent used then is, for example, a polar solvent such as N-methyl-2-pyrrolidone (NMP), N,N'-dimethylacetamide, N,N'-dimethylformamide, or γ-butyrolactone.

The other production conditions are not particularly limited, and the polyamic acid may be prepared by any common method, but the reaction temperature is chosen properly in the temperature range between room temperature and 200° C. The structure of the amic acid obtained can be analyzed, for example, by $^1$H-NMR.

The viscosity of the polyamic acid (C) is not particularly limited, if the object of the present invention is achieved, but a polyamic acid for use preferably have a viscosity, as determined by using NMP as a solvent at a solute concentration of 15 mass %, of 0.1 to 160 Pa·s/30° C., in particular 0.5 to 50 Pa·s/30° C.

The content ratio of the polyamic acid (B)+(C) to the polyamide-imide (A), ((B+C)/A), is normally 1/99 to 99/1, preferably 10/90 to 90/10 and more preferably 30/70 to 70/30 by mass. If the content ratio of the polyamic acid (B)+(C) is too low, it is not possible to obtain the advantageous effect of adding the polyamic acid (C) and to obtain a polyimide resin composition (in particular, film) sufficiently favorable in mechanical properties. On the contrary, an excessively high content ratio leads to increase in residual volatile material content, consequently causing high residual shrinkage stress and troubles such as deformation and warp.

The content ratio of the polyamide-imide (A) to the polyamic acid (B)+(C) is a value calculated respectively from the total amount of the monomer components used as raw materials.

The polyimide precursor resin composition according to the present invention normally contains a solvent and thus it is in the state of a solution containing the polyamide-imide (A), the polyamic acid (B), and as needed the polyamic acid (C) dissolved in the solvent. Such a solution will be referred to in particular as a polyimide precursor solution in the present specification. The concentration of the solid matter, in particular the total amount of the polyamide-imide (A), polyamic acid (B), and polyamic acid (C) in the polyimide precursor resin composition, in particular in the polyimide precursor solution, is not particularly limited, but is normally preferably 5 to 50 mass %, more preferably 10 to 35 mass %, with respect to the total amount. An excessively low content thereof is disadvantageous from the point of the production cost of the polyimide resin composition. On the contrary, an excessively high content may cause deterioration in storage stability.

The solvent is a compound that is liquid at 25° C. Typical examples of the solvent include amide-based solvents such as N-methyl-2-pyrrolidone, N,N-dimethylacetamide (DMAc) and N,N-dimethylformamide (DMF); ether compounds such as diethylene glycol, diethylene glycol monomethyl ether, triethylene glycol, triethylene glycol monomethyl ether, and triethylene glycol dimethylether; and the like, and these solvents may be used as a mixture of two or more solvents. The solvent is preferably an amide-based solvent, in particular N-methyl-2-pyrrolidone, N,N-dimethylacetamide (DMAc), or the mixture thereof. Normally, the solvent used during production of the polyimide precursor resin composition is contained as it is, and is preferably chosen properly according to the tetracarboxylic acid monomer units contained in the polyamic acid (B) from the viewpoint of compatibility between the polyamide-imide (A) and the polyamic acid (B) and also of transparency of the polyimide precursor resin composition. For example if the polyamic acid (B) contains the TC monomer unit (2p), NMP or DMAc is favorably used. For example if the polyamic acid (B) contains the TC monomer unit (2q), DMAc is favorably used. For example if the polyamic acid (B) contains the TC monomer unit (2r), NMP is favorably used.

In the polyimide precursor resin composition, the polyamide-imide (A), the polyamic acid (B) and the polyamic acid (C) added as needed are compatible with each other at room temperature. The phrase "compatible with each other" means that the solution is transparent without any apparent turbidity. The polyimide precursor solution, if it is opaque, causes aggregation and sedimentation of insoluble components during application, prohibiting uniform application and production of uniform films with favorable appearance. Such a solution is also unfavorable, because there is a concern about aggregation and sedimentation of insoluble components when it is stored for a prolonged period of time.

The viscosity of the polyimide precursor resin composition, in particular of the polyimide precursor solution, is not particularly limited, but, considering the coating efficiency, it is preferably in the range of 0.2 to 60 Pa·s (temperature: 30° C.)

The polyimide precursor resin composition according to the present invention may contain, as needed, surfactants, organic silane compounds, pigments, fillers such as conductive carbon black and metal fine particles, abrasives, dielectric compounds, lubricants, other polymers etc. in such a range that does not impair the advantageous effects of the invention. These additives are normally added at the stage of the polyimide precursor solution.

(Production Method for the Polyimide Precursor Resin Composition)

The polyimide precursor resin composition according to the present invention can be obtained by producing a polyamic acid (B) in the presence of a polyamide-imide (A). Specifically, the polyimide precursor resin composition is obtained by preparing a polyamic acid (B) in reaction (polymerization) of a predetermined tetracarboxylic acid component and a predetermined diamine component in the presence of a polyamide-imide (A) (Producing process 1). The polymerization is carried out normally in solvent, giving a polyimide precursor solution. The solvent for use may be a solvent similar to those described above for the polyimide precursor resin composition. In particular from the viewpoints of compatibility between the polyamide-imide (A) and the polyamic acid (B) and the transparency of the polyimide precursor resin composition, the solvent is preferably chosen properly according to tetracarboxylic acid monomer units contained in the polyamic acid (B), as described above. According to such a production method, a transparent polyimide precursor resin composition in which the polyamide-imide (A) and the polyamic acid (B) are dissolved in each other can be obtained, and a transparent polyimide resin composition superior in mechanical properties etc. can be obtained. If a polyamic acid (B) solution previously prepared separately is blended/mixed with the polyamide-imide (A) solution, the polyamide-imide (A) and the polyamic acid (B) is incompatible with each other, only giving an opaque polyimide precursor resin composition. Even if a polyamide-imide having the functional groups at the molecular terminals blocked with a blocking agent is used, it is only possible to obtain opaque polyimide precursor resin compositions. If the polyimide precursor resin composition is opaque, the polyimide resin composition obtained by using the composition is also opaque.

The method of producing a favorable polyimide precursor resin composition according to the present invention is more specifically as follows: Diamine components are added to and mixed in a polyamide-imide (A) solution. The mixing temperature is preferably −20 to 80° C., more preferably 50 to 80° C. The mixing time is preferably 5 to 300 minutes, more preferably 5 to 120 minutes. Tetracarboxylic acid components are then added to the solution, allowing reaction with the diamine components and thus forming a polyamic acid (B), to give a polyimide precursor solution. The temperature of the reaction between the diamine components and the tetracarboxylic acid components then is preferably −20 to 80° C., more preferably 50 to 80° C. The reaction time is preferably 10 to 400 minutes, more preferably 10 to 150 minutes.

The polyimide precursor resin composition according to the present invention obtained by producing a polyamic acid (B) in the presence of a polyamide-imide (A) is superior in compatibility with various polyamide-imides and/or polyamic acids, and thus, can be used industrially, advantageously as mixed and blended with various polyamide-imides and/or polyamic acids.

The polyamide-imide to be mixed and blended is the polyamide-imide (A) as described above, and specifically, may be a polyamide-imide similar to the polyamide-imide (A) used in production of the polyamic acid (B). Such a polyamide-imide (A) can be prepared by a method similar to that for the polyamide-imide (A). The composition (kind of monomers, etc.) of the polyamide-imide (A) to be mixed and blended and the polyamide-imide (A) used in preparation of the polyamic acid (B) in the Producing process 1 may be determined independently.

For example, the polyimide precursor resin composition according to the present invention containing the polyamide-imide (A) mixed and blended can be obtained by preparing a polyamic acid (B) in reaction (polymerization) of a predetermined tetracarboxylic acid component and a predetermined diamine component with each other in the presence of a polyamide-imide (A) and mixing one or more polyamide-imides (A) to the obtained product (Producing process 2). Polymerization and mixing are normally carried out in a solvent, to give a polyimide precursor solution. The solvent is a solvent similar to those described above for the polyimide precursor resin composition. In particular from the viewpoints of compatibility of the polyamide-imide (A) and the polyamic acid (B) and the transparency of the polyimide precursor resin composition, the solvent is preferably chosen properly according to the tetracarboxylic acid monomer units contained in the polyamic acid (B), as described above. The production conditions (polymerization condition) for the polyamic acid (B) in the presence of polyamide-imide (A) are the same as those in the Producing process 1. The polyamide-imide (A) to be mixed is used in the state of a solution. According to such a production method, a transparent polyimide precursor resin composition can be obtained even if a polyamide-imide (A) separately prepared is added additionally, and a transparent polyimide resin composition superior in mechanical properties etc. can be obtained.

The polyamic acid to be mixed and blended is not particularly limited and, for example, the polyamic acid (B) separately prepared or a polyamic acid (C) different at least in composition from the polyamic acid (B). The polyamic acid (B) to be mixed and blended is specifically the one that produced separately from the polyamic acid (B) produced in the presence of polyamide-imide (A) and may be a polyamic acid prepared only as a polyamic acid (B). Such a polyamic acid (B) can be prepared by a method similarly to the polyamic acid (B), except that no polyamide-imide (A) is present. The compositions (kind of monomers, etc.) of the polyamic acid (B) to be mixed and blended and the polyamic acid (B) produced in the presence of a polyamide-imide (A) may be determined independently.

For example, the polyimide precursor resin composition according to the present invention containing a polyamic acid (B) separately prepared can be obtained by preparing a polyamic acid (B) in reaction (polymerization) of a predetermined tetracarboxylic acid component and a predetermined diamine component in the presence of a polyamide-imide (A) and mixing one or more polyamic acids (B) separately prepared with the product obtained (Producing process 3). Polymerization and mixing are normally carried out in a solvent, giving a polyimide precursor solution. The solvent for use may be a solvent similar to those described above for the polyimide precursor resin composition. In particular from the viewpoints of compatibility of the polyamide-imide (A) and the polyamic acid (B) and the transparency of the polyimide precursor resin composition, the solvent is preferably chosen properly according to the tetracarboxylic acid monomer unit contained in the polyamic acid (B), as described above. The production conditions (polymerization condition) for the polyamic acid (B) in the presence of polyamide-imide (A) are the same as those in the Producing process 1. The polyamide-imide (B) to be mixed is used in the state of a solution. According to such a production method, a transparent polyimide precursor resin composition can be obtained even if a polyamide-imide (B) separately prepared is added additionally, and a transparent polyimide resin composition superior in mechanical properties etc. can be obtained.

For example the polyimide precursor resin composition according to the present invention containing polyamic acid (C) can be obtained by preparing a polyamic acid (B) in reaction (polymerization) of a predetermined tetracarboxylic acid component and a predetermined diamine component in the presence of a polyamide-imide (A) and mixing one or more polyamic acids (C) with the product obtained (Producing process 4). Polymerization and mixing are normally carried out in a solvent, giving a polyimide precursor solution. The solvent may be a solvent similar to those described above for the polyimide precursor resin composition. In particular from the viewpoints of compatibility of the polyamide-imide (A) and the polyamic acid (B) and the transparency of the polyimide precursor resin composition, the solvent is preferably chosen properly according to the tetracarboxylic acid monomer unit contained in the polyamic acid (B), as described above. The production conditions for the polyamic acid (B) are the same as those in the Producing process 1. The polyamic acid to be mixed is used in the state of a solution. According to such a production method, a transparent polyimide precursor resin composition can be obtained even if the polyamic acid (C) is mixed, and a transparent polyimide resin composition superior in mechanical properties etc. can be obtained.

(Polyimide Resin Composition and Production Method Thereof)

The polyimide resin composition according to the present invention can be prepared by imidating the polyimide precursor resin composition described above. Imidation can be carried out by a known method such as sintering at a temperature of 200° C. or higher. The reaction leads to dehydration and ring closure of the COOH groups and NH groups in the polyamic acid, forming imide rings.

Such a polyimide resin composition contains the polyimides formed by imidation of the polyamide-imides (A) and the polyamic acid (B), and the polyimide formed by imidation of added polyamic acid (C) added when desired. In particular, the polyimide has a chemical structure similar to those described above for the polyamic acid (B) or (C), except that imide rings are formed.

For example if the polyimide precursor resin composition contains a polyamide-imide (A) containing a diamine monomer unit represented by formula (1) and a polyamic acid (B) containing at least one kind of monomer unit selected from the group consisting of the tetracarboxylic acid monomer unit represented by formulae (2p) to (2r), the polyimide resin composition obtained from such a composition contains the polyamide-imide (A) and a polyimide containing at least one monomer units selected from the group consisting of tetracarboxylic acid monomer units represented by the following formulae (6p) to (6r).

[formula 9]

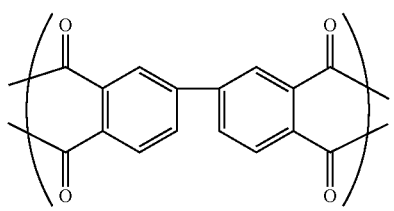

(6p)

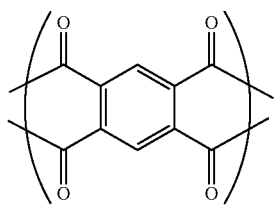

(6q)

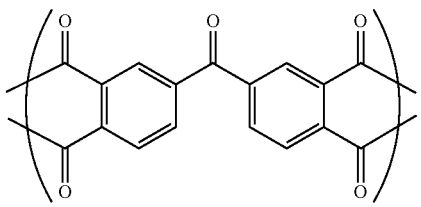

(6r)

Alternatively, for example if the polyimide precursor resin composition contains polyamide-imide (A), polyamic acid (B) and polyamic acid (C) as described above, the polyimide resin composition obtained from such a composition contains the polyamide-imide (A), a polyimide having a chemical structure similar to the polyamic acid (B) except that the imide ring are formed, and also a polyimide having a chemical structure similar to the polyamic acid (C) except that the imide rings are formed.

In particular, the diamine monomer unit represented by formula (3), the tetracarboxylic acid monomer unit represented by formula (2q), and the diamine monomer unit represented by formula (5) that may be contained in the polyamic acid are included in the polyimides respectively as the diamine monomer unit represented by the following formula (7), the tetracarboxylic acid monomer unit represented by the following formula (8), and the diamine monomer unit represented by the following formula (9).

[formula 10]

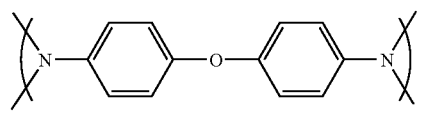

(7)

[formula 11]

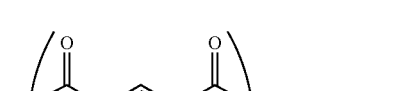

(8)

[formula 12]

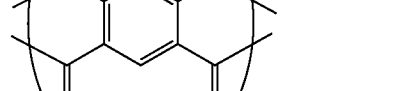

(9)

As described above, if part of the terminal groups of the polyamide-imide (A) are bound to part of the terminal groups of the polyamic acid (B) in reaction in the polyimide precursor resin composition, the bonds are preserved also in the polyimide resin composition.

The polyimide resin composition may have any shape, and for example, may be molded into a film, sheet, board or other shape.

In particular, the polyimide film of the polyimide resin composition can be produced by applying a polyimide precursor resin composition (in particular, polyimide precursor solution) on a substrate such as glass or metal foil, for example, with a bar coater, drying, imidating the film, and then separating the resulting film from the substrate. The polyimide film obtained by using the polyimide precursor resin composition according to the present invention is transparent, and the haze of the film having a thickness of 40 µm is 4% or less, preferably 3% or less.

(Applications)

The polyimide precursor resin composition according to the present invention and the polyimide resin composition prepared therefrom are particularly useful in the fields of electric and electronic parts.

The polyimide precursor resin composition according to the present invention is particularly suitable for production, for example, of insulated wire, flexible printed board and copying machine parts, among electric and electronic parts. Specifically, they are useful as a coating material of insulated wires, a cover lay film for flexible printed boards, a film for substrates, and a transfer belt and fixing belt for copying machines.

EXAMPLES

The present invention will be described specifically with reference to Examples. However, it should be understood that the present invention is not restricted to the Examples.

[Evaluation Method]

(1) Transparency of Polyimide Precursor Solution

The polyimide precursor solution was observed visually as it is, and the transparent solution was ranked as "○" and the heterogeneous opaque solution was ranked as "x".

(2) Rate of Residual Volatile Material at 180° C.

A polyimide precursor solution was applied on an electrolytic copper foil (thickness: 18 µm) by using an automatic film applicator (No. 542-AB-S, manufactured by Yasuda Seiki Seisakusho, Ltd) to give a thickness of approximately 40 µm after heat-treatment at 350° C., and heated in a hot air drier from 80° C. to 180° C. at a constant heating rate over 120 minutes and then kept at 180° C. for 120 minutes. After removal from the drier, the sample was cut into a piece of 20 cm square, and the mass thereof (g1) was determined. The sample was then placed again in the hot air drier and heat-treated at 350° C. for 120 minutes, removed from the drier, and then the mass thereof (g2) was determined. After removal of the copper foil by etching, the mass of the sample (g3) was determined. The rate of residual volatile material at 180° C. was determined in the following manner.

Rate of residual volatile material at 180° C. (mass %):

$(g1-(g2-g3)-g3)/\{g1-(g2-g3)\} \times 100$ g1: Mass of polyimide precursor resin+metal foil (g) after drying at 180° C.
g2: Mass of polyimide resin+metal foil (g) after baking at 350° C.
g3: Mass of polyimide resin (g) after baking at 350° C.

The rate of residual volatile material at 180° C. is an amount of residual volatile material after the polyimide precursor solution is dried, which is an indicator of possibility of deformation and warp of the film during imidation. The rate of residual volatile material at 180° C. is preferably 13.0 mass % or less, for practically eliminating the possibility of the troubles by deformation and warp.

(3) Film Transparency (Haze)

A polyimide precursor solution was applied on a glass plate by using an automatic film applicator (No. 542-AB-S, manufactured by Yasuda Seiki Seisakusho, Ltd) to give a thickness of 40 µm after heat-treatment at 350° C. for 120 minutes. The film was then heated from 80° C. to 160° C. over 80 minutes at a constant heating rate in a hot air drier, and also heated from 160° C. to 350° C. over 30 minutes at a constant rate. The film was then heat-treated at 350° C. for 120 minutes and separated from the glass plate, to give a polyimide film. The haze of the film obtained was determined according to JIS K-7105 by using a turbidity meter NDH2000 manufactured by Nippon Denshoku Industries Co., Ltd.

(4) Film Tensile Strength

A polyimide film having a thickness of 40 µm after heat-treatment at 350° C. was prepared similarly to the procedure in the "(3) Film transparency (haze)", and the tensile strength of the film was determined according to ASTM D882. Practically, the tensile strength is preferably 120 MPa or more, more preferably 150 MPa or more.

Example 1

PAI/Polyamic Acid (BPDA/ODA)=10/90 in NMP Solvent

Under dry air atmosphere, 5.47 g of 4,4'-diaminodiphenylether (4,4'-ODA) was added to 10.0 g of a polyamide-imide solution (VYLOMAX® HR11NN, manufactured by Toyobo Co., Ltd, solvent: NMP, resin concentration: 15.0 mass %, polyamide-imide having MDI and trimellitic acid monomer units, viscosity: 1.5 Pa·s/30° C., number-average molecular weight: 15000), and the mixture was agitated at 60° C. for 2 hours. NMP of 76.5 g was added to the solution; 8.03 g of 3,3'-4,4'-biphenyltetracarboxylic dianhydride (BPDA) was added gradually; and the mixture was agitated at 60° C. for 2 hours, to give a polyimide precursor solution having a solute concentration of 15.0 mass %. The viscosity of the polyimide precursor solution obtained was 40.7 Pa·s/30° C. The mass ratio of the polyamide-imide to the polyamic acid calculated from the raw material composition is 10/90.

Example 2

PAI/Polyamic Acid (BPDA/ODA)=30/70 in NMP Solvent

A polyimide precursor solution having a solute concentration of 15.0 mass % and a viscosity of 31.2 Pa·s/30° C. was prepared in a manner similar to Example 1, except that the amounts of the polyamide-imide solution, 4,4'-ODA, added NMP and BPDA used were respectively 30.0 g, 4.25 g, 59.5 g, and 6.25 g. The mass ratio of the polyamide-imide to the polyamic acid calculated from the raw material composition is 30/70.

Example 3

PAI/Polyamic Acid (BPDA/ODA)=50/50 in NMP Solvent

A polyimide precursor solution having a solute concentration of 15.0 mass % and a viscosity of 25.0 Pa·s/30° C. was prepared in a manner similar to Example 1, except that the amounts of the polyamide-imide solution, 4,4'-ODA, added NMP and BPDA used were respectively 50.0 g, 3.04 g, 42.5, and 4.46 g. The mass ratio of the polyamide-imide to the polyamic acid calculated from the raw material composition is 50/50.

Example 4

PAI/Polyamic Acid (BPDA/ODA)=70/30 in NMP Solvent

A polyimide precursor solution having a solute concentration of 15.0 mass % and a viscosity of 17.5 Pa·s/30° C. was prepared in a manner similar to Example 1, except that the amounts of the polyamide-imide solution, 4,4'-ODA, added NMP and BPDA used were respectively 70.0 g, 1.82 g, 25.5 g, and 2.68 g. The mass ratio of the polyamide-imide to the polyamic acid calculated from the raw material composition is 70/30.

Example 5

PAI/Polyamic Acid (BPDA/ODA)=90/10 in NMP Solvent

A polyimide precursor solution having a solute concentration of 15.0 mass % and a viscosity of 9.3 Pa·s/30° C. was prepared in a manner similar to Example 1, except that the amounts of the polyamide-imide solution, 4,4'-ODA, added NMP and BPDA used were respectively 90.0 g, 0.61 g, 8.5 g, and 0.89 g. The mass ratio of the polyamide-imide to the polyamic acid calculated from the raw material composition is 90/10.

Example 6

PAI/Polyamic Acid (BPDA+PMDA/ODA)=30/70 in NMP Solvent

A polyimide precursor solution was prepared in a manner similar to Example 1, except that the amounts of the polyamide-imide solution, 4,4'-ODA, added NMP and BPDA used were respectively 30.0 g, 1.82 g, 25.5 g, and 2.68 g. After addition of 2.87 g of 4,4'-ODA to 34.0 g of NMP in a separate container, 3.13 g of pyromellitic acid (PMDA) was added thereto gradually; the mixture was agitated at 60° C. for 2 hours; the polyimide precursor solution prepared (viscosity: 45.1 Pa·s/30° C.) was mixed with the polyimide precursor solution previously prepared; and the mixture was agitated at 65° C. for 6 hours, to give a polyimide precursor solution having a solute concentration of 15.0 mass % and a viscosity of 30.3 Pa·s/30° C. The mass ratio of the polyamide-imide to the polyamic acid calculated from the raw material composition is 30/70.

Example 7

PAI/Polyamic Acid (BPDA/ODA+PPD)=30/70 in NMP Solvent

A polyimide precursor solution was prepared in a manner similar to Example 1, except that the amounts of the polyamide-imide solution, 4,4'-ODA, added NMP and BPDA used were respectively 30.0 g, 1.93 g, 27.1 g, and 2.84 g. After addition of 1.54 g of para-phenylenediamine (PPD) to 32.4 g of NMP in a separate container, 4.19 g of BPDA was added thereto gradually; the mixture was agitated at 60° C. for 2 hours; the polyimide precursor solution prepared (viscosity: 48.8 Pa·s/30° C.) was mixed with the polyimide precursor solution previously prepared; and the mixture was agitated at 80° C. for 4 hours, to give a polyimide precursor solution having a solute concentration of 15.0 mass % and a viscosity of 33.6 Pas/30° C. The mass ratio of the polyamide-imide to the polyamic acid calculated from the raw material composition is 30/70.

Example 8

PAI/Polyamic Acid (BPDA/ODA)=50/50 in DMAc Solvent

Trimellitic anhydride (TMA) (3.31 g), 5.18 g of 4,4'-diphenylmethane diisocyanate (MDI), and 42.5 g of DMAc were placed in a reaction container under dry air atmosphere; and the mixture was agitated at 130° C. for 4 hours, to give a polyamide-imide solution (viscosity: 1.2 Pa·s/30° C.). A polyimide precursor solution having a solute concentration 15.0 mass % and a viscosity of 15.8 Pa·s/30° C. was prepared in a manner similar to Example 3, except that the polyamide-imide solution used was changed to this solution and the added solvent was changed to DMAc. The mass ratio of the polyamide-imide to the polyamic acid calculated from the raw material composition is 50/50.

Example 9

PAI/Polyamic Acid (BPDA+PMDA/ODA)=30/70 in DMAc Solvent 4,4'-ODA (1.82 g) was added to 30.0 g of the polyamide-imide solution (viscosity 1.0 Pa·s/30° C.) obtained in a manner similar to Example 8 except that the amounts of TMA, MDI and added DMAc used were respectively 1.98 g, 3.11 g and 25.5 g, and the mixture was agitated at 60° C. for 2 hours. DMAc of 25.52 g was added to the solution, and 2.68 g of BPDA was added gradually, and the mixture was agitated at 60° C. for 2 hours to give a polyimide precursor solution. After addition of 2.87 g of 4,4'-ODA to 34.0 g of DMAc in a separate container; 3.13 g of PMDA was added thereto gradually; the mixture was agitated at 60° C. for 2 hours; the polyimide precursor solution prepared (viscosity: 40.1 Pa·s/30° C.) was mixed with the polyimide precursor solution previously prepared; and the mixture was agitated at 65° C. for 6 hours to give a polyimide precursor solution having a solute concentration of 15.0 mass % and a viscosity of 19.1 Pa·s/30° C. The mass ratio of the polyamide-imide to the polyamic acid calculated from the raw material composition is 30/70.

Example 10

PAI/Polyamic Acid (PMDA/ODA)=50/50 in DMAc Solvent 4,4'-ODA of 3.59 g was added to 50.0 g of a polyamide-imide solution obtained in a manner similar to Example 8, and the mixture was agitated at 60° C. for 2 hours. DMAc of 42.5 g was added to the solution; 3.91 g of pyromellitic dianhydride (PMDA) was added gradually; and the mixture was agitated at 60° C. for 2 hours to give a polyimide precursor solution having a solute concentration of 15.0 mass %. The viscosity of the polyimide precursor solution was 14.7 Pa·s/30° C. The mass ratio of the polyamide-imide to the polyamic acid calculated from the raw material composition is 50/50.

Example 11

PAI/Polyamic Acid (PMDA+BPDA/ODA)=50/50 in DMAc Solvent

A polyimide precursor solution was prepared in a manner similar to Example 10, except that the amounts of the polyamide-imide solution, 4,4'-ODA, added DMAc and PMDA were respectively 30.0 g, 2.15 g, 25.5 g, and 2.35 g. After addition of 2.43 g of 4,4'-ODA to 34.0 g of DMAc in a separate container, 3.57 g of BPDA was added gradually; the mixture was agitated at 60° C. for 2 hours; the polyimide precursor solution prepared (viscosity: 42.0 Pa·s/30° C.) was mixed with the polyimide precursor solution previously prepared; the mixture was agitated at 65° C. for 6 hours to give a polyimide precursor solution having a solute concentration of 15.0 mass % and a viscosity of 19.6 Pa·s/30° C. The mass ratio of the polyamide-imide to the polyamic acid calculated from the raw material composition is 30/70.

Example 12

PAI/Polyamic Acid (BTDA/ODA)=50/50 in NMP Solvent

A polyimide precursor solution having a solute concentration of 15.0 mass % and a viscosity of 20.9 Pa·s/30° C. was prepared in a manner similar to Example 1, except that the amounts of the polyamide-imide solution, 4,4'-ODA, and added NMP used were respectively 50.0 g, 2.87 g and 42.5 g and BPDA was replaced with 4.63 g of 3,3',4,4'-benzophenonetetracarboxylic dianhydride (BTDA). The mass ratio of the polyamide-imide to the polyamic acid calculated from the raw material composition is 50/50.

Example 13

PAI/Polyamic Acid (BPDA+TPE)=50/50 in NMP Solvent

TPE-Q of 3.74 g was added to 50.0 g of a polyamide-imide solution similar to that in Example 1, and the mixture was agitated at 60° C. for 2 hours. NMP of 42.5 g was added to the solution; 3.76 g of BPDA was added gradually; and the mixture was agitated at 60° C. for 2 hours to give a polyimide precursor solution having a solute concentration of 15.0 mass %. The viscosity of the polyimide precursor solution was 22.6 Pa·s/30° C. The mass ratio of the polyamide-imide to the polyamic acid calculated from the raw material composition is 50/50.

Comparative Example 1

PAI/Polyamic Acid (ODPA/ODA)=50/50 in NMP Solvent

A polyimide precursor solution having a solute concentration of 15.0 mass % and a viscosity of 23.2 Pa·s/30° C. was prepared in a manner similar to Example 1, except that the amounts of the polyamide-imide solution, 4,4'-ODA, and added NMP used were respectively 50.0 g, 2.94 g and 42.5 g, and BPDA was replaced with 4.56 g of oxydiphthalic dianhydride (ODPA). The mass ratio of the polyamide-imide to the polyamic acid calculated from the raw material composition is 50/50.

Comparative Example 2

PEI/Polyamic Acid (BPDA/ODA)=50/50 in NMP Solvent 4,4'-ODA of 3.04 g was added to a PEI solution containing 7.5 g of polyether imide (grade 1000, manufactured by GE Plastics Japan, Ltd) dissolved in 42.5 g of NMP, and the mixture was agitated at 60° C. for 2 hours. NMP of 42.5 g was added to the solution; 4.46 g of BPDA was added gradually; and the mixture was agitated at 60° C. for 2 hours to give a polyimide precursor solution having a solute concentration of 15.0 mass % and a viscosity of 180.5 Pa·s/30° C. The weight ratio of the polyether imide to the polyamic acid as calculated from the raw material composition is 50/50.

Comparative Example 3

PAI/Polyamic Acid (BPDA/ODA)=50/50 in NMP Solvent 4,4'-ODA of 3.04 g was added to 42.5 g of NMP; 4.46 g of BPDA was added gradually; the mixture was agitated at 60° C. for 2 hours; the polyimide precursor solution prepared (viscosity: 43.2 Pa·s/30° C.) was mixed with 50.0 g of the commercially available polyamide-imide solution used in Example 1; the mixture was agitated at room temperature for 2 hours to give a polyimide precursor solution having a solute concentration of 15.0 mass % and a viscosity of 20.4 Pa·s/30° C. The mass ratio of the polyamide-imide to the polyamic acid calculated from the raw material composition is 50/50.

Evaluation results of the polyimide precursor solutions and the polyimide films obtained in Examples 1 to 13 and Comparative Examples 1 to 3 are summarized in Table 1.

TABLE 1

|  | Polyamide-imide (A) (PAI) | | Polyamic (B) (PAA) | | Polyamic acid (C) (PAA) | | PAI/PAA |
| --- | --- | --- | --- | --- | --- | --- | --- |
|  | Acid component | Diamine component/ diisocyanate component | Acid component | Diamine component | Acid component | Diamine component | [A / B] Mass ratio |
| Example 1 | TMA | MDI | BPDA | ODA | — | — | 10/90 |
| Example 2 | TMA | MDI | BPDA | ODA | — | — | 30/70 |
| Example 3 | TMA | MDI | BPDA | ODA | — | — | 50/50 |
| Example 4 | TMA | MDI | BPDA | ODA | — | — | 70/30 |
| Example 5 | TMA | MDI | BPDA | ODA | — | — | 90/10 |
| Example 6 | TMA | MDI | BPDA[(3)] | ODA | PMDA[(3)] | ODA | 50/50 |
| Example 7 | TMA | MDI | BPDA | ODA[(4)] | BPDA | PPD[(4)] | 50/50 |
| Example 8 | TMA | MDI | BPDA | ODA | — | — | 50/50 |
| Example 9 | TMA | MDI | BPDA[(3)] | ODA | PMDA[(3)] | ODA | 50/50 |
| Example 10 | TMA | MDI | PMDA | ODA | — | — | 50/50 |
| Example 11 | TMA | MDI | PMDA[(5)] | ODA | BPDA[(5)] | ODA | 50/50 |
| Example 12 | TMA | MDI | BTDA | ODA | — | — | 50/50 |

TABLE 1-continued

| | | | | | | | |
|---|---|---|---|---|---|---|---|
| Example 13 | TMA | MDI | BPDA | TPE-Q | — | — | 50/50 |
| Comparative Example 1 | TMA | MDI | ODPA | ODA | — | — | 50/50 |
| Comparative Example 2 | PEI[(1)] | | BPDA | ODA | — | — | 50/50[(2)] |
| Comparative Example 3 | TMA | MDI | BPDA | ODA | — | — | 50/50 |

| | PAI/PAA [A / (B + C)] Mass ratio | Solvent | Production method | Precursor solution transparency | Residual volatile material rate (mass %) | Haze (%) | Tensile strength (MPa) |
|---|---|---|---|---|---|---|---|
| Example 1 | — | NMP | Production method A | ○ | 12.6 | 1.7 | 191 |
| Example 2 | — | NMP | Production method A | ○ | 10.1 | 1.5 | 188 |
| Example 3 | — | NMP | Production method A | ○ | 7.3 | 1.1 | 190 |
| Example 4 | — | NMP | Production method A | ○ | 5.2 | 0.6 | 185 |
| Example 5 | — | NMP | Production method A | ○ | 2.5 | 0.5 | 167 |
| Example 6 | 30/70 | NMP | Production method A | ○ | 9.8 | 2.1 | 169 |
| Example 7 | 30/70 | NMP | Production method A | ○ | 9.7 | 2.2 | 214 |
| Example 8 | — | DMAc | Production method A | ○ | 3.2 | 0.7 | 165 |
| Example 9 | 30/70 | DMAc | Production method A | ○ | 4.1 | 0.6 | 154 |
| Example 10 | — | DMAc | Production method A | ○ | 3.8 | 0.5 | 152 |
| Example 11 | 30/70 | DMAc | Production method A | ○ | 4.2 | 0.9 | 157 |
| Example 12 | — | NMP | Production method A | ○ | 7.2 | 0.8 | 129 |
| Example 13 | — | NMP | Production method A | ○ | 7.6 | 1.1 | 187 |
| Comparative Example 1 | — | NMP | Production method A | ○ | 7.0 | 26.1 | 125 |
| Comparative Example 2 | — | NMP | Production method A | × | 7.5 | 71.2 | 110 |
| Comparative Example 3 | — | NMP | Production method B | × | 7.1 | 86.2 | 175 |

ODA = 4,4'-ODA
[(1)]Polyether imide,
[(2)]PEI/PAA,
[(3)]BPDA/PMDA = 39/61 (molar ratio),
[(4)]ODA/PPD = 38/62 (molar ratio),
[(5)]PMDA/BPDA = 47/53 (molar ratio)
Production method A: Polyamic acid (B) was prepared in the presence of polyamide-imide (A).
Production method B: Polyamic acid (B) separately prepared was mixed with polyamide-imide (A).

As clearly shown in Table 1, in Examples 1 to 13, transparent polyimide precursor solutions were obtained, and polyimide films having a haze of 3.0% or less and a practically sufficient tensile strength were obtained from the precursor solutions. These films have a low rate of residual volatile material at 180° C. and were thus resistant to deformation and warp of the film during imidation of the polyimide precursor resin composition after drying.

In contrast, in Comparative Example 1, wherein no compound specified by the present invention was used as the tetracarboxylic acid component of polyamic acid, the precursor solution obtained was transparent, but the film obtained was opaque and had a haze of more than 20%. In Comparative Example 2, wherein no polyamide-imide essential in the present invention was contained, the polyimide precursor solution obtained was opaque, and the film obtained also had insufficient tensile strength. On Comparative Example 3, wherein the polyimide precursor solution was not prepared in polyamide, the polyimide precursor solution was opaque, and the film obtained also had relatively larger haze.

INDUSTRIAL APPLICABILITY

The polyimide resin composition, the polyimide precursor resin composition and the production method thereof, and also the polyimide film and the preparation method thereof according to the present invention are useful in the fields of electric and electronic parts and others.

The invention claimed is:

1. A polyimide precursor resin composition, comprising a polyimide-imide (A) containing a diamine monomer unit represented by the following formula (1) and a poly amic acid (B) containing at least one kind of monomer unit selected from the group consisting of tetracarboxylic acid monomer units represented by the following formulae (2p) to (2r), wherein the haze of the film having a thickness of 40 μm obtained by imidation of the polyimide precursor resin composition is 4% or less;

wherein the polyamic acid (B) is obtained by reacting a diamine component with at least one kind of monomer unit selected from the group consisting of tetracarboxylic acid monomer units represented by the following formulae (2p) to (2r) in the presence of the polyamide-imide (A) at 60-80° C.;

[Formula 1]

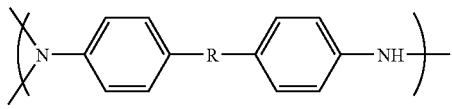
(1)

wherein R represents an alkylene group having 1 to 5 carbon atoms;

[Formula 2]

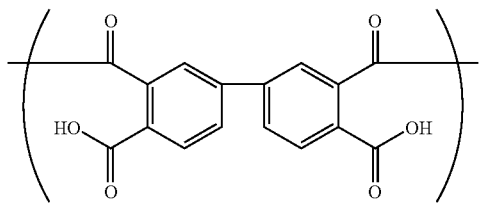
(2p)

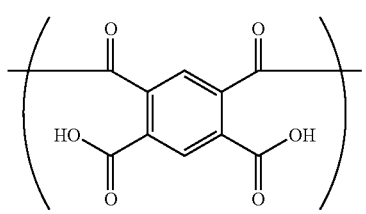
(2q)

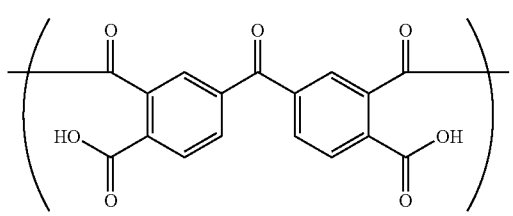
(2r)

2. The polyimide precursor resin composition according to claim 1, wherein the polyamic acid (B) contains a diamine monomer unit represented by the following formula (3):

[Formula 3]

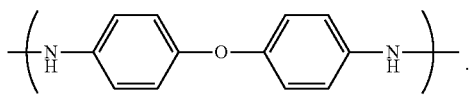
(3)

3. The polyimide precursor resin composition according to claim 1, wherein the content ratio (A/B) of the polyamide-imide (A) to the polyamic acid (B) is 1/99 to 99/1 by mass.

4. A method of producing the polyimide precursor resin composition of claim 1, comprising a producing a polyamic acid (B) by reacting a diamine component with a tetracarboxylic acid component in the presence of a polyamide-imide (A).

5. A method of producing the polyimide precursor resin composition of claim 1, comprising:
producing a polyamic acid (B) by reacting a diamine component with a tetracarboxylic acid component in the presence of the polyamide-imide (A) and;
mixing the resulting product with one or more polyamide-imides (A) and/or one or more separately prepared polyamic acids (B).

6. The polyimide precursor resin composition according to claim 1, wherein the polyamic acid (B) is a polyamic acid (b1) containing one kind of monomer unit selected from the group consisting of tetracarboxylic acid monomer units represented by formulae (2p) to (2r) alone as the tetracarboxylic acid monomer unit, and
a polyamic acid (c1) containing a tetracarboxylic acid monomer unit other than the tetracarboxylic acid monomer unit of the polyamic acid (b1) is further contained.

7. The polyimide precursor resin composition according to claim 6, wherein the polyamic acid (B) is a polyamic acid (b1) containing the tetracarboxylic acid monomer unit represented by formula (2p) alone as the tetracarboxylic acid monomer unit, and the polyamic acid (c1) contains the tetracarboxylic acid monomer unit represented by formula (2q).

8. The polyimide precursor resin composition according to claim 6, wherein the polyamic acid (B) is a polyamic acid (b1) containing the tetracarboxylic acid monomer unit represented by formula (2q) alone as the tetracarboxylic acid monomer unit, and the polyamic acid (c1) contains the tetracarboxylic acid monomer unit represented by formula (2p).

9. The polyimide precursor resin composition according to claim 6, wherein the polyamic acid (c1) contains the diamine monomer unit represented by formula (3).

10. The polyimide precursor resin composition according to claim 6, being obtained by producing a polyamic acid (B) by reacting a diamine component with a tetracarboxylic acid component in the presence of the polyamide-imide (A) and mixing the resulting product with the polyamic acid (c1).

11. A method of producing the polyimide precursor resin composition of claim 6, comprising:
producing a polyamic acid (B) by reacting a diamine component with a tetracarboxylic acid component in the presence of a polyamide-imide (A) and;
mixing the resulting product with a polyamic acid (c1).

12. The polyimide precursor resin composition according to claim 1, wherein the polyamic acid (B) is a polyamic acid (b2) containing the diamine monomer unit represented by the formula (3) only as the diamine monomer unit, and a polyamic acid (c2) containing a diamine monomer unit other than the diamine monomer unit represented by the formula (3) is further contained.

13. The polyimide precursor resin composition according to claim 12, wherein the polyamic acid (c2) contains a diamine monomer unit represented by the following Formula (5):

[Formula 4]

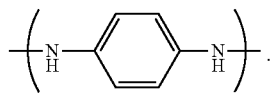
(5)

14. The polyimide precursor resin composition according to claim 12, wherein the polyamic acid (c2) contains the tetracarboxylic acid monomer unit represented by formula (2p).

15. The polyimide precursor resin composition according to claim 12, being obtained by producing a polyamic acid (B) in reaction of a diamine component with a tetracarboxylic acid component in the presence of the polyamide-imide (A) and mixing the resulting product with the polyamic acid (c2).

16. A method of producing the polyimide precursor resin composition of claim 12, comprising;
    producing a polyamic acid (B) by reacting a diamine component with a tetracarboxylic acid component in the presence of a polyamide-imide (A) and;
    mixing the resulting product with a polyamic acid (c2).

17. The polyimide precursor resin composition according to claim 1, containing a solvent.

18. The polyimide precursor resin composition according to claim 17, wherein the solvent is N-methyl-2-pyrrolidone, N,N-dimethylacetamide, or the mixture thereof.

19. The polyimide precursor resin composition according to claim 17, wherein a solid matter concentration is 5 to 50 mass %.

20. A polyimide resin composition, presented by imidation of the polyimide precursor resin composition according to claim 1.

21. A method of producing a polyimide resin composition, comprising imidating the polyimide precursor resin composition according to claim 1.

22. A polymide film, comprising the polyimide resin composition according to claim 20.

23. A method of producing a polyimide film, comprising casting, drying and imidating the polyimide precursor resin composition according to claim 17.

* * * * *